United States Patent
Nakamura et al.

(10) Patent No.: US 10,718,832 B2
(45) Date of Patent: Jul. 21, 2020

(54) MAGNETIC RESONANCE IMAGING APPARATUS AND ADJUSTMENT METHOD THEREOF

(71) Applicant: CANON MEDICAL SYSTEMS CORPORATION, Otawara-Shi (JP)

(72) Inventors: Haruki Nakamura, Nasushiobara (JP); Sadanori Tomiha, Nasushiobara (JP)

(73) Assignee: CANON MEDICAL SYSTEMS CORPORATION, Otawara-Shi (JP)

( * ) Notice: Subject to any disclaimer, the term of this patent is extended or adjusted under 35 U.S.C. 154(b) by 76 days.

(21) Appl. No.: 15/961,943

(22) Filed: Apr. 25, 2018

(65) Prior Publication Data

US 2018/0313917 A1    Nov. 1, 2018

(30) Foreign Application Priority Data

Apr. 27, 2017    (JP) ................................ 2017-088003

(51) Int. Cl.
     *G01R 33/36*             (2006.01)
     *G01R 33/58*             (2006.01)
     *G01R 33/54*             (2006.01)

(52) U.S. Cl.
     CPC ..... *G01R 33/3607* (2013.01); *G01R 33/3614* (2013.01); *G01R 33/3628* (2013.01); *G01R 33/3664* (2013.01); *G01R 33/583* (2013.01); *G01R 33/543* (2013.01)

(58) Field of Classification Search
     CPC .............. G01R 33/3607; G01R 33/583; G01R 33/3614; G01R 33/3628; G01R 33/3664
     See application file for complete search history.

(56) References Cited

U.S. PATENT DOCUMENTS

| | | | | |
|---|---|---|---|---|
| 5,172,061 | A * | 12/1992 | Crooks | G01R 33/3628 324/318 |
| 7,583,083 | B2 * | 9/2009 | Biber | G01R 33/3621 324/307 |
| 7,723,988 | B2 * | 5/2010 | Schwilch | G01R 33/3671 324/318 |
| 9,634,493 | B2 * | 4/2017 | Shimokawa | H02J 5/005 |
| 9,989,602 | B2 * | 6/2018 | Imamura | G01R 33/36 |
| 10,036,794 | B2 * | 7/2018 | Kimmlingen | G01R 33/56383 |
| 10,048,337 | B2 * | 8/2018 | Yokoi | A61B 6/56 |

(Continued)

FOREIGN PATENT DOCUMENTS

JP           11-309128           11/1999

*Primary Examiner* — Dixomara Vargas
(74) *Attorney, Agent, or Firm* — Oblon, McClelland, Maier & Neustadt, L.L.P.

(57) ABSTRACT

An adjustment method according to an embodiment of a magnetic resonance imaging apparatus, including a transmission coil configured to transmit a radio frequency (RF) pulse and an RF amplifier configured to transmit an RF pulse signal to the transmission coil, includes steps of detecting and adjusting. The detecting step detects an output power level of the RF amplifier. The adjusting step adjusts a line length of a transmission line to be provided between the RF amplifier and the transmission coil such that the output power level of the RF amplifier exceeds a predetermined value in a state where there is a load on the transmission coil, or such that the output power level of the RF amplifier falls below a predetermined value in a state where there is no load on the transmission coil.

14 Claims, 9 Drawing Sheets

(56) References Cited

U.S. PATENT DOCUMENTS

| | | | | |
|---|---|---|---|---|
| 10,148,231 B2* | 12/2018 | Hussein | ................... | H03F 1/56 |
| 2008/0061783 A1* | 3/2008 | Schwilch | ........... | G01R 33/3621 |
| | | | | 324/318 |
| 2014/0070809 A1* | 3/2014 | Imamura | ................ | G01R 33/36 |
| | | | | 324/319 |
| 2014/0070812 A1* | 3/2014 | Yokoi | .................... | A61B 6/032 |
| | | | | 378/4 |
| 2015/0015254 A1* | 1/2015 | Zhu | ........................ | A61B 5/055 |
| | | | | 324/309 |
| 2015/0316629 A1* | 11/2015 | Kawajiri | .......... | G01R 33/34092 |
| | | | | 324/322 |
| 2016/0163047 A1* | 6/2016 | Oh | ....................... | G01R 33/543 |
| | | | | 382/131 |
| 2017/0160358 A1* | 6/2017 | Miura | ................ | G01R 33/3852 |
| 2017/0261573 A1* | 9/2017 | Nakamura | .......... | G01R 33/3614 |
| 2017/0359034 A1* | 12/2017 | Hussein | ................... | H03F 1/56 |
| 2018/0365808 A1* | 12/2018 | Jiang | ........................ | G06T 5/009 |
| 2019/0098444 A1* | 3/2019 | Hwang | .................. | H04B 17/27 |

\* cited by examiner

MAGNETIC RESONANCE IMAGING APPARATUS AND ADJUSTMENT METHOD THEREOF

CROSS-REFERENCE TO RELATED APPLICATION

This application is based upon and claims the benefit of priority from Japanese Patent Application No. 2017-088003, filed on Apr. 27, 2017, the entire contents of which are incorporated herein by reference.

FIELD

An embodiment as an aspect of the present invention relates to a magnetic resonance imaging (MRI) apparatus and an adjustment method thereof.

BACKGROUND

The MRI apparatus performs an imaging of an object placed on a table, and acquires internal data of the object as image data.

The MRI apparatus includes a transmission coil, such as a whole body (WB) coil, for transmitting high frequency pulses, that is, radio frequency (RF) pulses. The WB coil receives RF pulse signals from an RF transmitter, and excites atomic nuclear spins of an imaging site placed in the static magnetic field with high frequency pulses of Larmor frequency, that is, the RF pulses. Then, the MRI apparatus receives magnetic resonance signals, that is, MR signals generated from the imaging site with the excitation by a receiving coil, for example a local coil, and generates the image data based on the MR signals.

A transmission line for transmitting the RF pulses is provided between the RF transmitter and the WB coil which is a load of the RF transmitter. The impedance (that is, a load impedance) of the WB coil is set so as to coincide with the characteristic impedance (for example, 50 [$\Omega$]) of the transmission line.

However, the load impedance varies depending on a weight of a patient placed in the WB coil and the imaging site of the patient.

BRIEF DESCRIPTION OF THE DRAWINGS

In accompanying drawings.

DETAILED DESCRIPTION

An embodiment of the present invention will be described below with reference to the accompanying drawings.

An adjustment method according to an embodiment of a magnetic resonance imaging apparatus, including a transmission coil configured to transmit an RF pulse and an RF amplifier configured to transmit an RF pulse signal to the transmission coil, includes steps of detecting and adjusting. The detecting step detects an output power level of the RF amplifier. The adjusting step adjusts a line length of a transmission line to be provided between the RF amplifier and the transmission coil such that the output power level of the RF amplifier exceeds a predetermined value in a state where there is a load on the transmission coil, or such that the output power level of the RF amplifier falls below a predetermined value in a state where there is no load on the transmission coil.

1. First Embodiment

Figure 1:
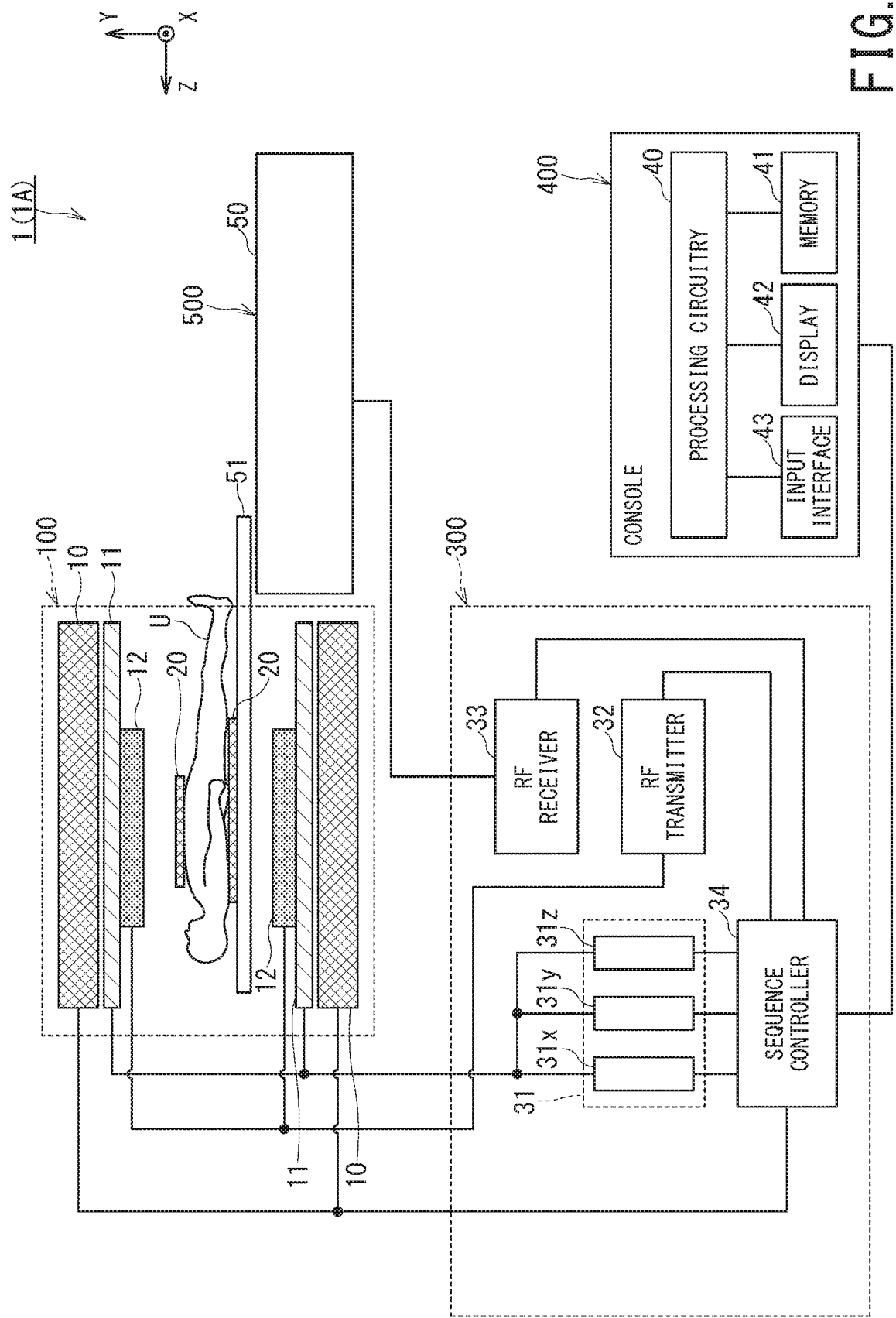
FIG. 1 is a schematic diagram showing entire constitution of an MRI apparatus according to a first embodiment.

FIG. 1 is a schematic diagram showing entire constitution of an MRI apparatus 1 according to a first embodiment.

FIG. 1 shows an MRI apparatus 1 according to the first embodiment. The MRI apparatus 1 includes a magnet rack 100, a control cabinet 300, a console 400, and a bed 500. The magnet rack 100, the control cabinet 300, and the bed 500 are generally provided in an examination room. The examination room is also called the imaging room. The console 400 is provided in a control room. The control room is also called an operation room.

The magnet rack 100 has a static magnetic field magnet 10, a gradient magnetic field coil 11, and a WB coil 12. These components are accommodated in a housing having cylindrical shape. The bed 500 has a bed body 50 and a table T.

The control cabinet 300 includes a gradient magnetic field power supply 31 (for X-axis 31x, for Y-axis 31y, and for Z-axis 31z), an RF transmitter 32, an RF receiver 33, and a sequence controller 34.

The console 400 includes processing circuitry 40, a memory 41, a display 42, and an input interface 43. The console 400 functions as a host computer.

The static magnetic field magnet 10 of the magnet rack 100 is roughly divided into a tunnel type and an open type. In the tunnel type, the magnet has a cylindrical magnet structure. In the open type, a pair of magnets is arranged above and below the imaging space. In the embodiment, the case where the static magnetic field magnet 10 is the tunnel type will be described, but the present invention is not limited to that case.

The static magnetic field magnet 10 has a substantially cylindrical shape and generates a static magnetic field in a bore into which an object or a patient U, for example, is conveyed. The bore is a space inside a cylinder of the magnet rack 100. The static magnetic field magnet 10 is composed of: a casing for holding liquid helium; a refrigerator for cooling the liquid helium to an extremely low temperature; and a superconducting coil inside the casing. It should be noted that the static magnetic field magnet 10 may be constituted by a normal conductive magnet or a permanent magnet. Hereinafter, the case where the static magnetic field magnet 10 has the superconducting coil will be described.

The static magnetic field magnet 10 incorporates the superconductive coil, and the superconductive coil is cooled to the extremely low temperature by the liquid helium. The static magnetic field magnet 10 generates a static magnetic field by applying a current supplied from a power supply device for the static magnetic field in an excitation mode to the superconductive coil. After that, when the mode changes to a permanent current mode, the power supply device for the static magnetic field is separated. Once the mode has changed to the permanent current mode, the static magnetic field magnet 10 continues to generate a large static magnetic field over a long period of time, for 1 year or more, for example.

The gradient magnetic field coil 11 has a substantially cylindrical shape similarly to the static magnetic field magnet 10 and is installed inside the static magnetic field magnet 10. The gradient magnetic field coil 11 applies a gradient magnetic field to the patient U by electric power supplied from the gradient magnetic field power supply 31.

In the embodiment, since an eddy current generated with the generation of the gradient magnetic field interferes with imaging, an actively shielded gradient coil (ASGC) with a purpose of reduction of the eddy current may be used as the gradient magnetic field coil 11, for example. The ASGC is a gradient magnetic field coil in which a shield coil for minimizing effect of leakage current is provided on an outer side of a main coil for forming gradient magnetic fields in the X-axis, Y-axis, and Z-axis directions, respectively.

The WB coil 12 is installed substantially in a cylindrical shape so as to surround the patient U on an inner side of the gradient magnetic field coil 11. The WB coil 12 functions as a transmission coil. That is, the WB coil 12 transmits an RF pulse toward the patient U according to an RF pulse signal transmitted from the RF transmitter 32. On the other hand, the WB coil 12 may function as a reception coil in addition to function as the transmission coil. In this case, the WB coil 12 receives an MR signal emitted from the patient U by excitation of a nucleus.

The MRI apparatus 1 may include a local coil 20 as shown in FIG. 1 in addition to the WB coil 12. The local coil 20 is placed in the vicinity of a body surface of the patient U. The local coil 20 may include coil elements. These coil elements are arranged on an array and inside the local coil 20, and are called PAC (Phased Array Coil) in some cases.

The local coil 20 has several types. For example, the local coil 20 has types such as a body coil installed at a chest part, a belly part or a leg part of the patient U as shown in FIG. 1, and a spine coil installed on a back side of the patient U and the like. Besides, the local coil 20 has types such as a head coil for imaging a head part of the patient U and a foot coil for imaging a foot and the like. Moreover, the local coil 20 has types such as a wrist coil for imaging a wrist, a knee coil for imaging a knee, a shoulder coil for imaging a shoulder and the like.

The local coil 20 functions as the reception coil. That is, the local coil 20 receives the afore-mentioned MR signal. However, the local coil 20 may be a transmission and reception coil having the function as the transmission coil for transmitting the RF pulse in addition to the function as the reception coil for receiving the MR signal. For example, in the head coil and the knee coil as the local coil 20, there is also the transmission and reception coil. That is, the type of the local coil 20 may be any type of transmission only, reception only, or transmission and reception.

The gradient magnetic field power supply 31 includes the gradient magnetic field power supply devices $31x$, $31y$, and $31z$ for each channel for driving each of the coils generating the gradient magnetic fields of the X-axis, the Y-axis, and the Z-axis. The gradient magnetic field power supply devices $31x$, $31y$, and $31z$ independently output required current waveforms to each channel in accordance with an instruction of a sequence controller. As a result, the gradient magnetic field coil 11 can apply gradient magnetic fields in the X-axis, Y-axis, and Z-axis directions to the patient U.

The RF transmitter 32 generates an RF pulse signal based on an instruction from the sequence controller 34. The RF transmitter 32 transmits the generated RF pulse signal to the WB coil 12. The detailed configuration of the RF transmitter 32 will be described later with reference to FIG. 2.

The MR signal received by the local coil 20 or more specifically, the MR signal received by each of the coil elements in the local coil 20 is transmitted to the RF receiver 33. An output line of each coil element and an output line of WB coil 12 are called "channel". Therefore, each of the coil elements and each MR signal output from the WB coil 12 may be referred to as a channel signal. The channel signal received by the WB coil 12 is also transmitted to the RF receiver 33.

The RF receiver 33 analog-to-digital (AD)-converts the received channel signal, that is, MR signal, and outputs it to the sequence controller 34. The MR signal which has been changed to a digital one is also called "raw data" in some cases.

The sequence controller 34 images the patient U by driving the gradient magnetic field power supply 31, the RF transmitter 32, and the RF receiver 33, respectively, on the basis of control by the console 400. The sequence controller 34 transmits, when the raw data is received from the RF receiver 33 by imaging, the raw data to the console 400.

The sequence controller 34 includes processing circuitry (not shown). This processing circuitry is constituted by a processor for executing a predetermined program and hardware such as a field programmable gate array (FPGA), an application specific integrated circuit (ASIC) and the like, for example.

The console 400 includes the processing circuitry 40, the memory 41, the display 42, and the input interface 43.

The processing circuitry 40 means any one of dedicated or general central processing unit (CPU) and a micro-processor unit (MPU), an application specific integrated circuit (ASIC), and a programmable logic device. The programmable logic device may be, for example, any one of a simple programmable logic device (SPLD), a complex programmable logic device (CPLD), a field programmable gate array (FPGA) and the like. The processing circuitry 40 reads programs stored in the memory 41 or directly implemented in the processing circuitry 40, and executes these programs to achieve following functions.

The processing circuitry 40 may be a single processing circuit or a combination of multiple processing circuit elements. In the latter case, the memory 41 includes multiple memory elements each storing an element of a program, each of the multiple memory elements is provided for each of the multiple processing circuit elements. Alternatively, the memory 41 includes a single memory storing the program, the single memory is provided for the multiple processing circuit elements.

The memory 41 is made up of semiconductor memory devices such as a random access memory (RAM) and a flash memory, hard discs, optical discs, and the like. The memory 41 may be made up of a portable media such as a universal serial bus (USB) memory and a digital video disk (DVD). The memory 41 stores various processing programs (including application programs, as well as an operating system (OS)) used in the processing circuitry 40, data necessary for executing the programs, and image data. Moreover, the OS may include a graphic user interface (GUI) which frequently uses graphics for displaying information for the operator on the display 42, and allows basic operations to be performed by use of the input interface 43.

The display 42 is a display device such as a liquid crystal display panel, a plasma display panel, and an organic electro luminescence (EL) panel.

The input interface 43 includes an input device which can be operated by the operator, and an input circuit for inputting a signal from the input device. The input device includes a pointing device (for example, a mouse), a keyboard, various buttons, and the like. When the input device is operated by the operator, the input circuit generates a signal corresponding to the operation and outputs it to the processing circuitry 40. It should be noted that the MRI apparatus 1 may include a touch panel in which the input device is integrated with the display 42.

The bed 500 includes a bed body 50 and a table 51. The bed body 50 is able to move the table 51 in the X-axis direction, the Y-axis direction, and the Z-axis direction. The movement of the table 51 in the X-axis direction is a movement in a lateral direction of the patient U, that is, in a short-side direction of the table 51. The movement of the table 51 in the Y-axis direction is a movement in a vertical direction of the table 51, that is, in a thickness direction of the table 51. The movement of the table 51 in the Z-axis direction is a movement in a front-rear direction of the table 51, that is, in a longitudinal direction of the table 51. Prior to imaging, the patient U placed on the table 51 is moved in the Y-axis direction up to a predetermined height. Thereafter, the bed body 50 moves the table 51 in the Z-axis direction to move the patient U into the magnet rack 100.

Figure 2:
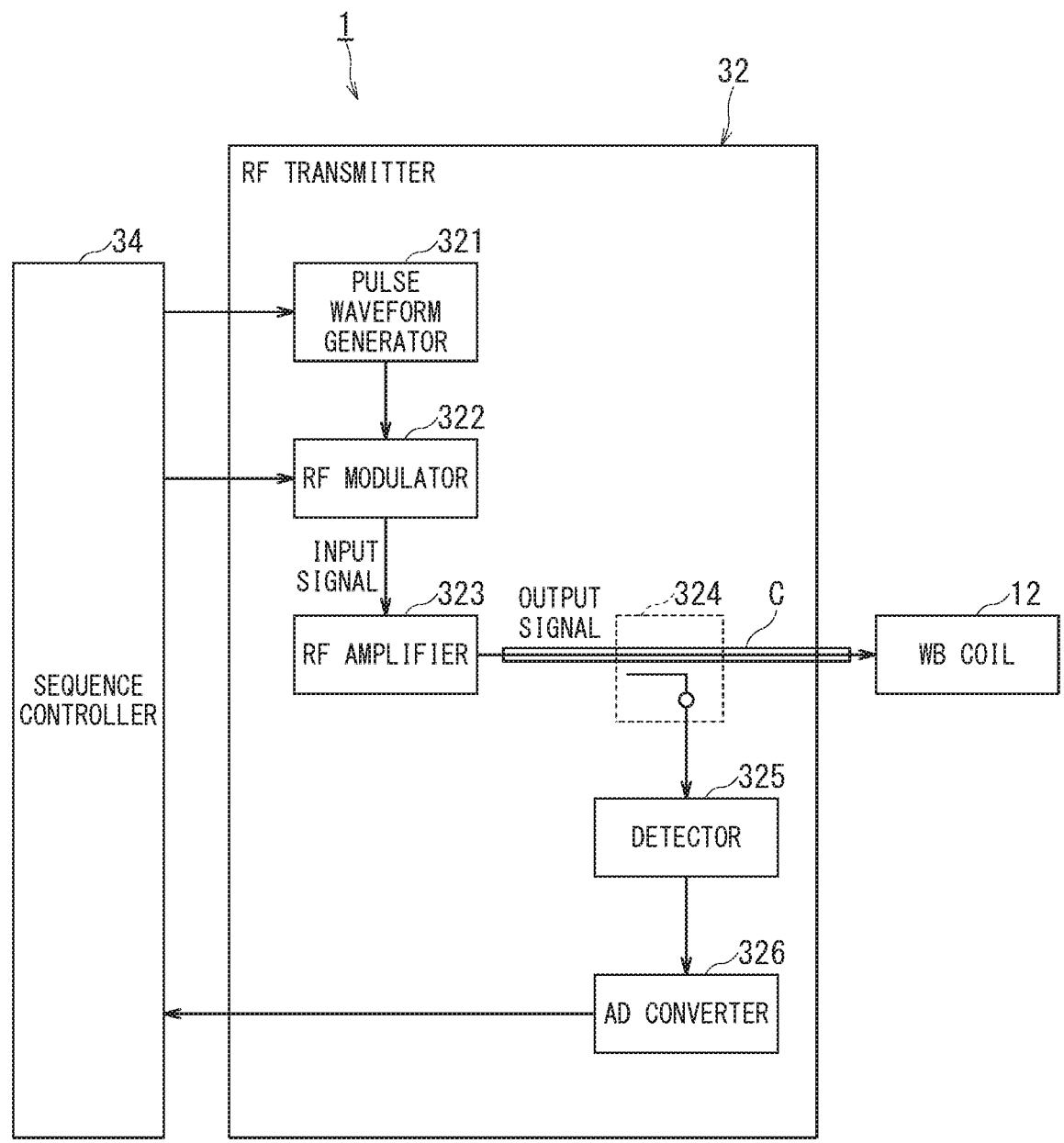
FIG. 2 is a diagram showing a detailed configuration of an RF transmitter provided in the MRI apparatus according to the first embodiment.

FIG. 2 is a diagram showing a detailed configuration of the RF transmitter 32 provided in the MRI apparatus 1. FIG. 2 also shows a connection relationship between the RF transmitter 32 and the WB coil 12.

As shown in FIG. 2, the RF transmitter 32 includes a pulse waveform generator 321, an RF modulator 322, an RF amplifier 323, a directional coupler 324, a detector 325, and an analog to digital (AD) converter 326. Between the RF transmitter 32 and the WB coil 12, a phase adjusting cable (hereinafter simply referred to as "cable") C is provided.

The pulse waveform generator 321 generates envelope data under the control of the sequence controller 34.

The RF modulator 322 mixes, under the control of the sequence controller 34, the carrier wave with the envelope data generated by the pulse waveform generator 321, and thereby generating an RF pulse signal having a resonance frequency.

The RF amplifier 323 amplifies the RF pulse signal modulated by the RF modulator 322 and transmits it to the transmission coil, for example, the WB coil 12. The WB coil 12 transmits, in response to the transmitted RF pulse signal, the RF pulse to the patient U (shown in FIG. 1). It should be noted that the one that transmits the RF pulse by the transmission of the RF pulse signal from the RF transmitter 32 is not limited to the WB coil 12, but may be the local coil such as the head coil and the knee coil described above.

The directional coupler 324 is disposed on the transmission line of the RF pulse signal in a non-contact manner on the transmission line. The directional coupler 324 attenuates the RF pulse signal transmitted to the WB coil 12 with a required degree of coupling (coupling coefficient), and transmits it to the detector 325.

The detector 325 detects the output signal of the directional coupler 324.

The AD converter 326 digitally converts the output signal detected by the detector 325. The output data of the AD converter 326 is used as an RF pulse signal to measure a specific absorption rate (SAR), and the output power of the RF amplifier 323 described later.

A load impedance of the WB coil 12 is usually designed so as to coincide with the characteristic impedance (for example, 50 [$\Omega$]) of the transmission line of the RF pulse signal. However, the load impedance shows different values depending on a weight of the patient U placed in the WB coil 12, and an imaging site of the patient U. Therefore, the characteristic impedance of the transmission line of the RF pulse signal is not perfectly matched with the load impedance, and a reflected wave reflected from the WB coil 12 toward the RF transmitter 32 is generated.

Then, due to the influence of the load impedance or the reflected wave, the transmission efficiency of the RF amplifier 323 in the RF transmitter 32 may decrease. If the transmission efficiency decreases, an average power performance may be degraded in some cases. This is because the transmission efficiency contributes to the average power performance that the RF amplifier can output.

For example, the transmission efficiency is expressed by a ratio of the output power level of the RF amplifier 323 to the input power level, that is, an expression "output power level/input power level". In other words, the transmission efficiency is a ratio of a power supplied to the load to a power supplied to the amplifying element (field effect transistor: FET), that is, an expression "power supplied to load/power supplied to amplifying element".

In order to suppress the decrease in the transmission efficiency of the RF amplifier 323, a method may be adopted in which a circulator is provided inside the RF amplifier to transmit reflected waves to another line in an effort to avoid reaching the RF amplifier of the reflected wave. Alternatively, a method may be adopted in which a hybrid 90-degree distribution circuit is provided in front of the WB coil, and the reflected wave is canceled by the circuit. As a result, the reduction in the transmission efficiency of the RF transmitter due to the influence of the reflected wave is suppressed. However, when adopting the above-described method including the circulator, the cost for the high-power circulator is high because it is a high-price component. When adopting the above-described method including the hybrid 90-degree distribution circuit, there is a high possibility that it is necessary to newly develop the WB coil, and development expenses and time are required.

According to findings of the inventors, it is known that the transmission efficiency of the RF amplifier 323 fluctuates according to the phase of the load impedance of the WB coil 12. That is, even when the same power is input to the RF amplifier 323, the power that can be output by the RF amplifier 323 varies depending on the phase of the load impedance of the WB coil 12.

Therefore, in the present embodiment, the length of the transmission line (hereinafter simply referred to as "line length") for transmitting the RF pulse signal from the RF amplifier 323 to the WB coil 12 is adjusted, and the RF amplifier 323 can be used in a state of high transmission efficiency. Adjusting the line length means adjusting the phase of the load impedance seen from the RF amplifier 323.

If the circulator and the hybrid 90 degree distribution circuit are not provided between the RF amplifier 323 and the WB coil 12, the reflected wave may reach the RF amplifier 323 in some cases. However, even if such a reflected wave exists, the phase of the load impedance, that is, the line length between the RF amplifier 323 and the WB coil 12 is adjusted, so that the transmission efficiency of the RF amplifier 323 is increased.

Subsequently, a method of adjusting the line length between the RF amplifier 323 and the WB coil 12 will be described.

This adjustment is performed in a state where a high load phantom (for example, a large mass phantom) whose output power of the RF amplifier 323 exceeds a predetermined value is installed in the WB coil 12 at the time of installation of the device or the like. This is because the high transmission efficiency is required when the load on the WB coil 12 is high, that is, when the large output power from the RF amplifier 323 is required. It should be noted that it is not always necessary to adjust the line length in a case of imaging a patient U having a small mass or in a case where the imaging site is limited (for example, the head). This is because the required output power is small, so it is not necessary to consider the transmission efficiency so much.

Subsequently, an operation of the MRI apparatus 1, that is, the method of adjusting the line length between the RF amplifier 323 and the WB coil 12 will be described with reference to FIGS. 2 and 3.

Figure 3:
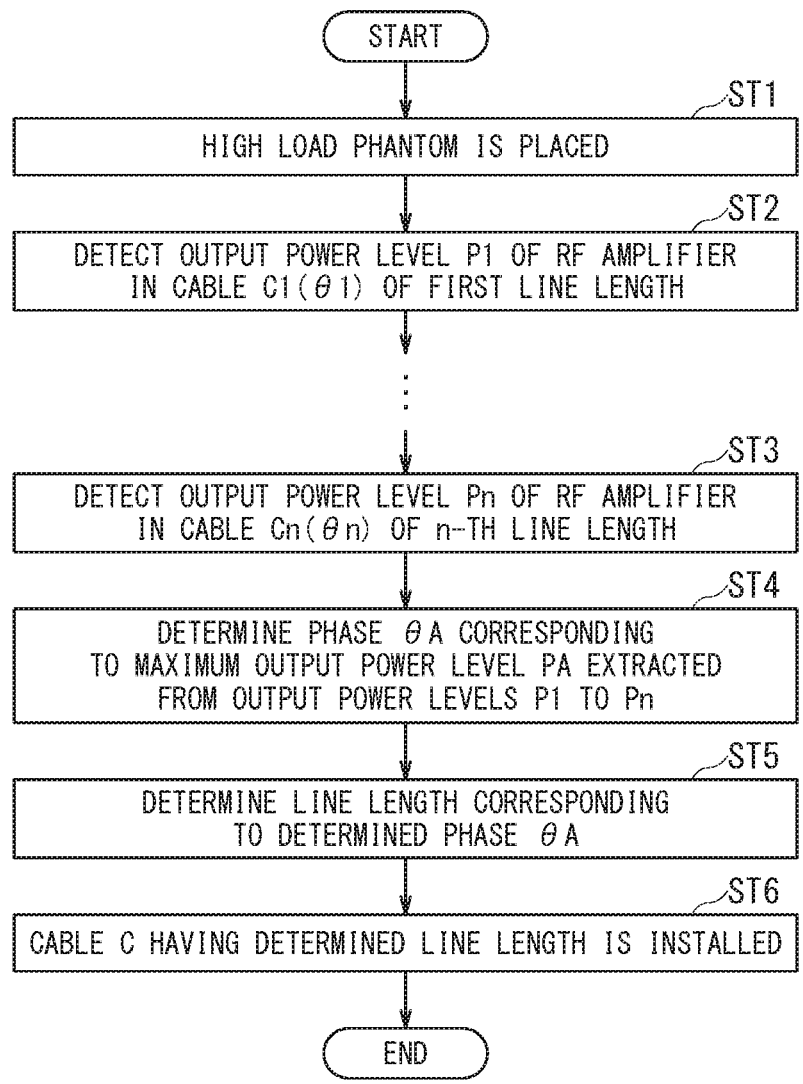
FIG. 3 is a flowchart showing an operation of the MRI apparatus according to the first embodiment.

FIG. 3 is a flowchart showing the operation of the MRI apparatus 1. The MRI apparatus 1 adjusts the line length of the transmission line to be provided between the RF amplifier 323 and the WB coil 12 so as to maximize the transmission efficiency of the RF amplifier 323, based on the maximum output power when the output power of the RF amplifier 323 is detected in a high load state in which the output power exceeds a predetermined value.

Figure 4:
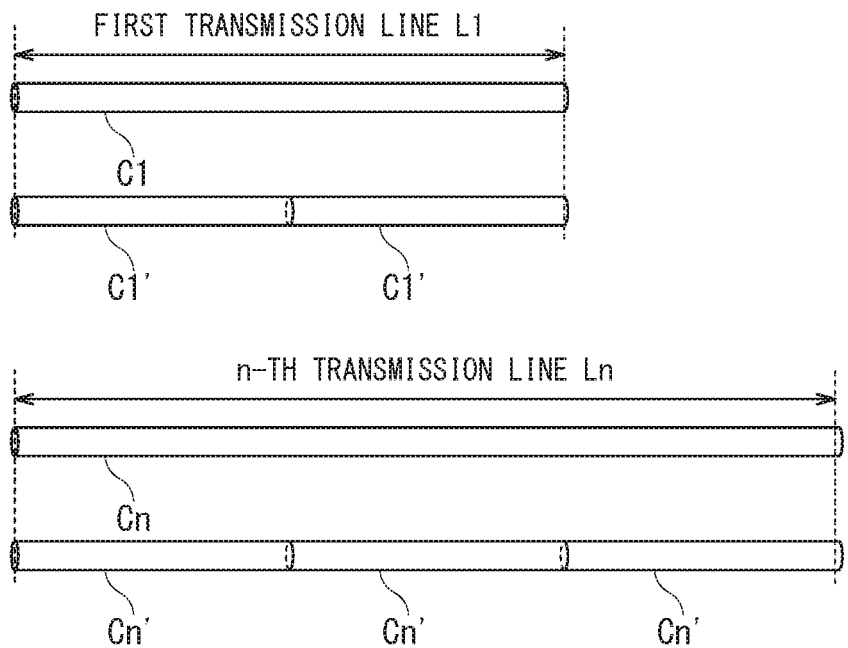
FIG. 4 is a diagram showing an example of a cable constituting each line length in the MRI apparatus according to the first embodiment.

The installer prepares n (n is an integer equal to or more than 2) transmission lines having n line lengths, that is, first to n-th transmission lines L1 to Ln having first to n-th line lengths. The first to n-th transmission lines L1 to Ln having different line lengths respectively correspond to the phases θ1 to θn. Each transmission line may be composed of a single cable or a combination of multiple cables. FIG. 4 is a diagram showing an example of a cable constituting each line length in the MRI apparatus 1. As shown in FIG. 4, a first transmission line L1 having a first line length is constituted by a first cable C1 or constituted by multiple cable elements C1'.

Figure 5:
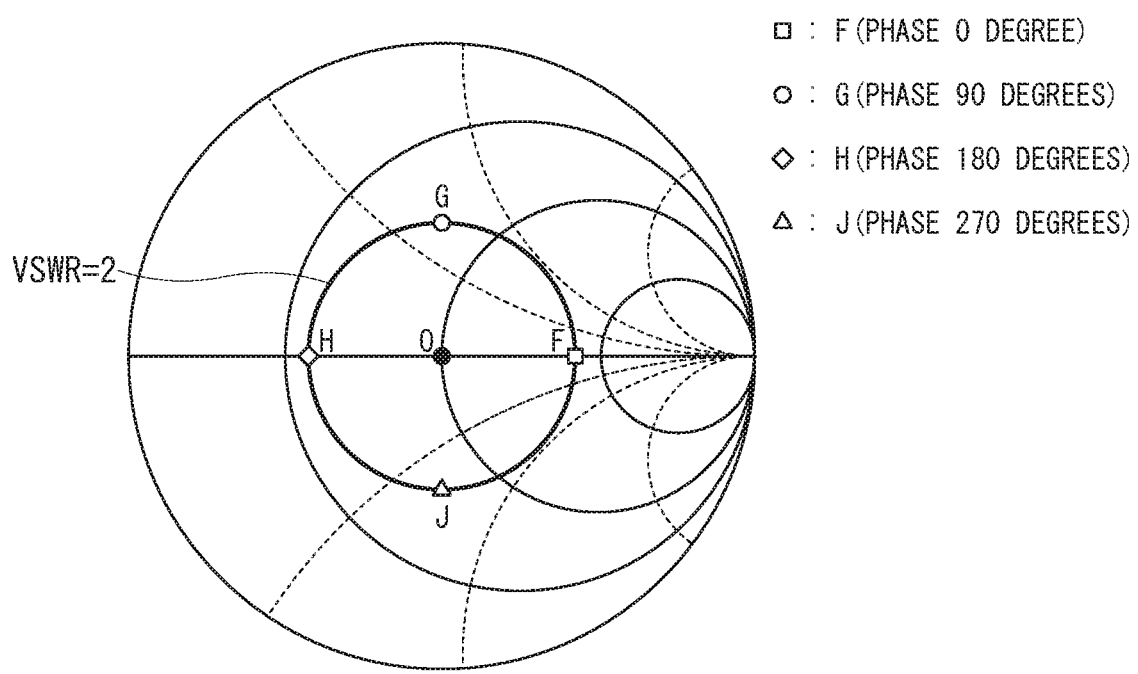
FIG. 5 is a diagram showing a relationship between the line length and the load impedance as the Smith chart, in the MRI apparatus according to the first embodiment.

FIG. 5 is a diagram showing a relationship between the line length and the load impedance as the Smith chart, in the MRI apparatus 1.

The Smith chart is obtained by assigning normalized impedance (admittance) to the complex reflection coefficient ρ expressed in polar coordinates. In the embodiment, complex reflection coefficient ρ is calculated from the load impedance ZL connected to the receiving end (z=0) of the transmission line to be provided between the RF amplifier 323 and the WB coil 12, and the characteristic impedance Z0 to satisfy the following expression (1).

$$\rho = \frac{Z_L - Z_0}{Z_L + Z_0} \quad (1)$$

In the Smith chart, the radius from the center O is the amplitude |ρ|, and the phase angle ρ is expressed by the angle measured from the right side of the real axis. The Smith chart is made up of a circle group (thin solid line) that varies depending on the resistance component of the normalized impedance, and a circle group (broken line) that varies according to the reactance component. Since the amplitude |ρ| corresponds to the voltage standing wave ratio (VSWR: Voltage Standing Wave Ratio) in one-to-one correspondence, a circle centered on the origin O in the Smith chart is also a set of points where VSWR=constant. FIG. 5 shows a circle (thick solid line) in the case of VSWR=−2 showing the same reflectance on the premise that there is a reflected wave. VSWR is given by the following expression (2) based on the amplitude |ρ|.

$$VSWR = \frac{1 + |\rho|}{1 - |\rho|} \quad (2)$$

If the load impedance changes variously, the point displayed on the Smith chart also changes variously. If the line length varies, only the phase angle of the load impedance changes on the circle where "VSWR=constant". If the line length is lengthened by one wavelength of the waveform of the RF pulse signal, the phase θ of the load impedance is rotated 360 degrees. If the line length becomes longer by a quarter wavelength, the phase of the load impedance is rotated by 90 degrees. The three points (G, H, and J), shown in FIG. 5, indicate the phases of the load impedances when the line length is increased by one fourth wavelength, one-half wavelength and three fourth wavelength with respect to a reference length corresponding to a point F.

Returning to the explanation of FIG. 3, a high load phantom is placed in an imaging area by the installer (step ST1). The high load phantom is a phantom which simulates the emission of an MR signal from a human body part having a predetermined mass. In steps ST2 to ST3, the sequence controller 34 outputs the RF pulse signals when the n patterns of cables C1 to Cn having different phases are respectively installed in the MRI apparatus 1, and detects the output power levels P1 to Pn of the RF amplifier 323, based on the RF pulse signals output from the AD converter 326. That is, in steps ST2 to ST3, the n cables C1 to Cn installed in the MRI apparatus 1 are sequentially switched so that the sequence controller 34 detects the output power level P1 to Pn of the RF amplifier 323 corresponding to the n cables C1 to Cn.

Specifically, the installer temporarily installs the first transmission line L1 having the first line length, that is, the first cable C1 (phase θ1) in the MRI apparatus 1. The sequence controller 34 outputs the RF pulse signal in the first cable C1 and detects the output power level P1 of the RF amplifier 323, based on the RF pulse signal output from the AD converter 326 (step ST2). Then, the installer temporarily installs the n-th transmission line Ln having the n-th line length, that is, the n-th cable Cn (phase θn) in the MRI apparatus 1, instead of the (n−1)-th cable. The sequence controller 34 outputs the RF pulse signal in the n-th cable Cn and detects the output power level Pn of the RF amplifier 323, based on the RF pulse signal output from the AD converter 326 (step ST3).

The sequence controller 34 determines a predetermined phase, that is, a predetermined phase θA (shown in FIG. 6) corresponding to the maximum output power level PA (shown in FIG. 6) extracted from the n output power levels P1 to Pn detected in steps ST2 to ST3 (step ST4). The predetermined phase θA means a phase at which the transmission efficiency is the highest.

In the embodiment, since the high load phantom is placed at step ST1, the sequence controller 34 adopts the maximum output power level PA in step ST4 so as to obtain a phase when the transmission efficiency of the RF amplifier 323 is good in the case of imaging a high-load imaging target. On the other hand, if a low load phantom is placed or if being with no load (without a phantom), the sequence controller 34 adopts the minimum output power level so as to obtain a phase when the transmission efficiency of the RF amplifier 323 is good in the case of imaging a high load imaging target. This case will be explained in a modified example which will be described later.

Figure 6:
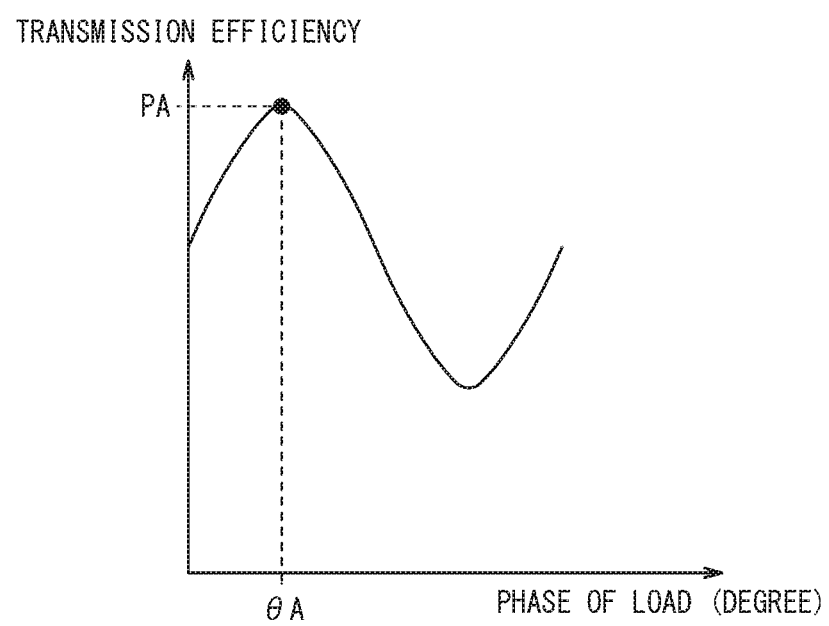
FIG. 6 is a graph showing a relationship between the phase and the transmission efficiency in the MRI apparatus according to the first embodiment.

FIG. 6 is a graph showing a relationship between the phase and the transmission efficiency in the MRI apparatus 1.

With the phase change shown in FIG. 5, the outputtable transmission efficiency shown in FIG. 6 changes. In step ST4 shown in FIG. 3, a predetermined phase θA corresponding to the maximum output power level PA is determined.

Returning to the explanation of FIG. 3, the sequence controller 34 determines the line length corresponding to the predetermined phase θA determined in step ST4 (step ST5). The installer installs the cable C having the line length determined in step ST5 between the RF amplifier 323 and the transmission coil (step ST6). That is, the cable C installed by the step ST6 is a cable selected from n cables C1 to Cn having different line lengths. Further, the cable C is a cable corresponding to the line length indicating the maximum output power level PA extracted from the n output power levels P1 to Pn corresponding to the n cables C1 to Cn detected in the high load state.

According to the MRI apparatus 1, the cable having the line length designed by placing the high load phantom set assuming the high load imaging target is installed between the RF amplifier 323 and the transmission coil. Thereby, according to the MRI apparatus 1, even if there is the reflected wave, it is possible to perform an imaging without impairing the transmission efficiency of the RF amplifier 323. The high-load imaging target is, for example, a large imaging site such as a patient U having a large mass, an abdomen, a chest, or the like.

According to the MRI apparatus 1, the cable C having the line length designed by placing the high load phantom is installed between the RF amplifier 323 and the transmission coil. Thereby, according to the MRI apparatus 1, it is possible to avoid an internal power supply error caused by a reduction in the transmission efficiency of the RF amplifier 323.

According to the MRI apparatus 1, it is unnecessary to provide the circulator inside the RF amplifier so as to avoid reaching the RF amplifier of the reflected wave, or to provide the hybrid 90-degree distribution circuit at the front stage of the WB coil. Thereby, according to the MRI apparatus 1, it is possible to reduce the cost of adopting the above-described method including the circulator, and to reduce the development cost and time when adopting the above-described method including the hybrid 90-degree distribution circuit.

Modified Example

The method of obtaining the line length corresponding to the phase with good transmission efficiency of the RF amplifier 323 in the case of imaging the high load imaging target when the high load phantom is placed in step ST1 of FIG. 3 has been described. However, it is not limited to that case. Next, a method of obtaining a line length corresponding to a phase with good transmission efficiency of the RF amplifier 323 in a case of imaging the high load imaging target when a low load phantom is placed will be described. In the low load phantom, the output power of the RF amplifier 323 is less than a predetermined value. Instead of placing the low load phantom, a no-load state (no phantom) in which the inside of the WB coil is empty may be used.

Figure 7:
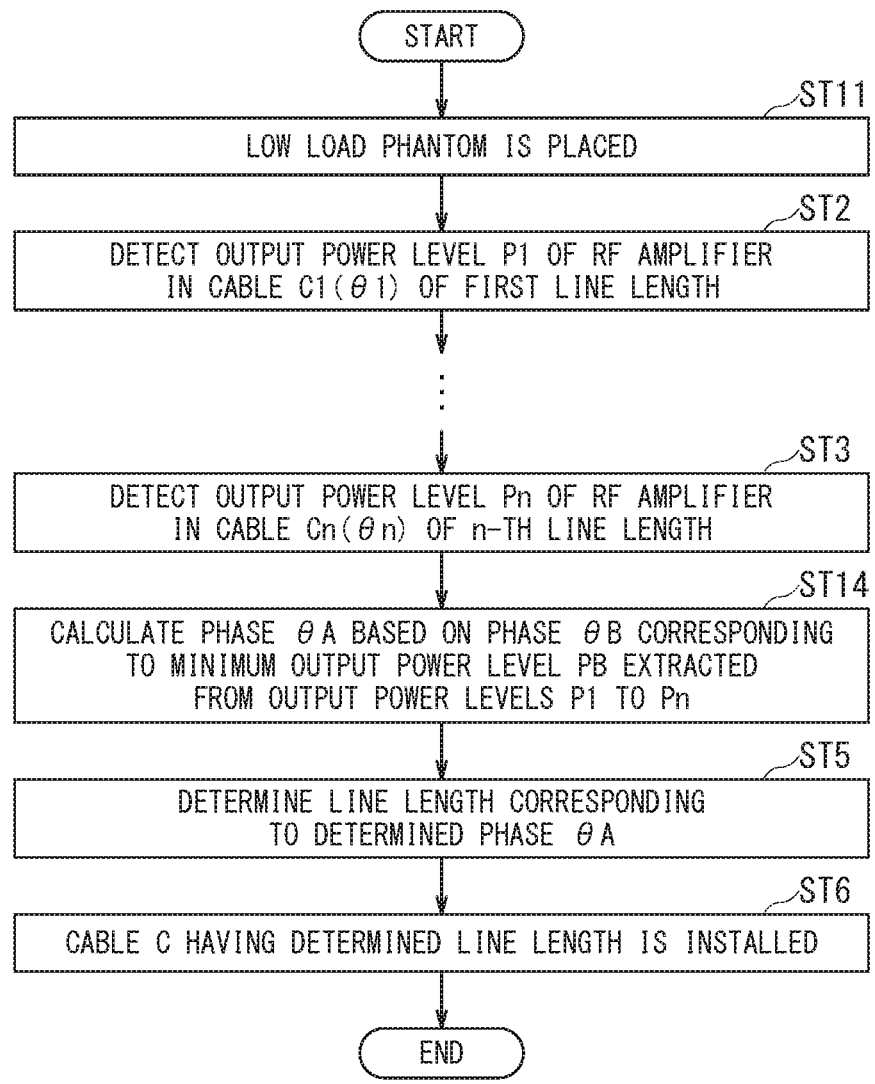
FIG. 7 is a flowchart showing an operation of the modified example of the MRI apparatus according to the first embodiment.

With reference to FIGS. 2 and 7, an operation of the modified example of the MRI apparatus 1, that is, a method of adjusting the line length between the RF amplifier 323 and the WB coil 12 will be described.

FIG. 7 is a flowchart showing the operation of the modified example of the MRI apparatus 1. The modified example of the MRI apparatus 1 adjusts, based on the minimum output power detected in a low load state, the line length of the transmission line to be provided between the RF amplifier 323 and the WB coil 12 so that the transmission efficiency of the RF amplifier 323 is substantially maximized.

In FIG. 7, the same steps as those shown in FIG. 3 are denoted by the same reference numerals, and the explanation thereof is omitted.

The installer prepares n transmission lines having n line lengths, that is, first to n-th transmission lines L1 to Ln having first to n-th line lengths. The first to n-th transmission lines L1 to Ln having different line lengths respectively correspond to the phases θ1 to θn.

A low load phantom, in which the output power of the RF amplifier 323 is lower than a predetermined value, is placed in the imaging area by the installer (step ST11).

The sequence controller 34 determines a predetermined phase, that is, a predetermined phase θB (shown in FIG. 9) corresponding to the minimum output power level PB extracted from the n output power levels P1 to Pn detected in steps ST2 to ST3, and calculates, based on the phase θB, a predetermined phase θA (shown in FIG. 9) corresponding to the maximum output power level PA. (step ST14).

In step ST14, the sequence controller 34 obtains the minimum output power level extracted from the n output power levels P1 to Pn in order to obtain a phase with good transmission efficiency of the RF amplifier 323 in the case of imaging a high load imaging target, and calculates a predetermined phase θA shifted by a predetermined phase from the phase θB corresponding to the minimum output power level.

That is, the cable C installed in step ST6 through step ST14 is a cable selected from n cables C1 to Cn having different line lengths. The cable C is selected from n output power levels P1 to Pn corresponding to n cables C1 to Cn detected in the low load state, and the cable C is a cable having a line length obtained by adding/subtracting a predetermined line length to/from a line length showing the minimum output power level PB.

Figure 8:
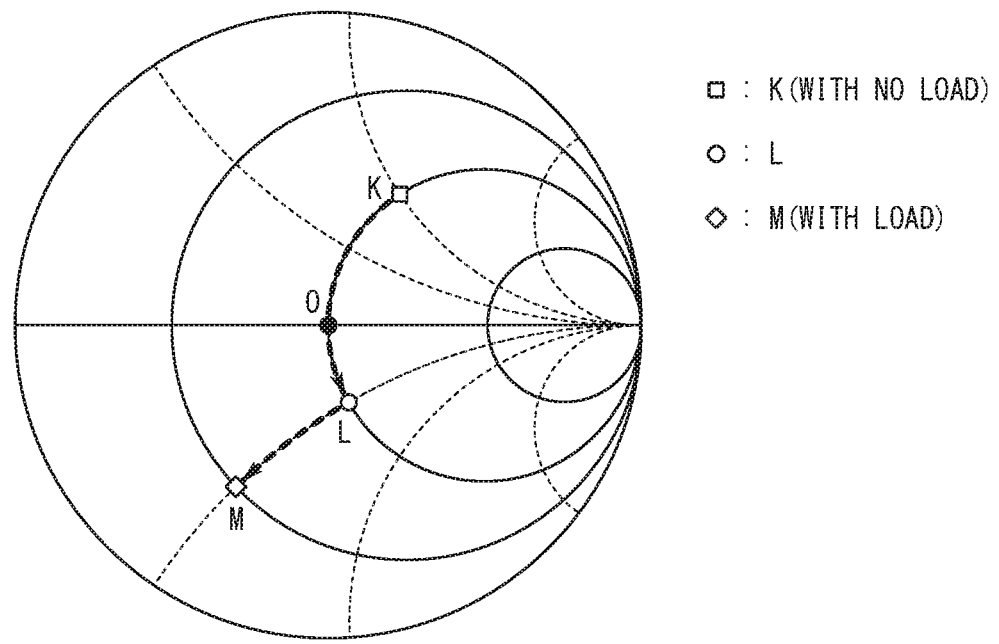
FIG. 8 is a diagram showing a transition from a phase with no-load to a phase with load as the Smith chart in the MRI apparatus according to the first embodiment.

FIG. 8 is a diagram showing a transition from a phase with no-load to a phase with load as the Smith chart in the MRI apparatus 1.

As shown in FIG. 8, when transitioning from the no-load state to the load state, the transmission coil and the load are electrically coupled, so that a point K (the phase θB with no-load) on the Smith chart moves to a point L on the internal equal resistance circle in accordance with a thick dashed arrow, and that moves to a point M (the phase θA with load) on the internal equal reactance circle from the point L in accordance with a thick dashed arrow. As a result, the phase θB with no-load greatly changes to the phase θA with no-load (shown as an arrow in FIG. 9).

It should be noted that the sequence controller 34 may calculate, depending on the placed phantom, a phase θA shifted by a predetermined phase from a phase corresponding to an output power level corresponding to an inflection point etc., the output power level be extracted from n output power levels P1 to Pn. For example, the inflection point is a point V shown in FIG. 9.

Figure 9:
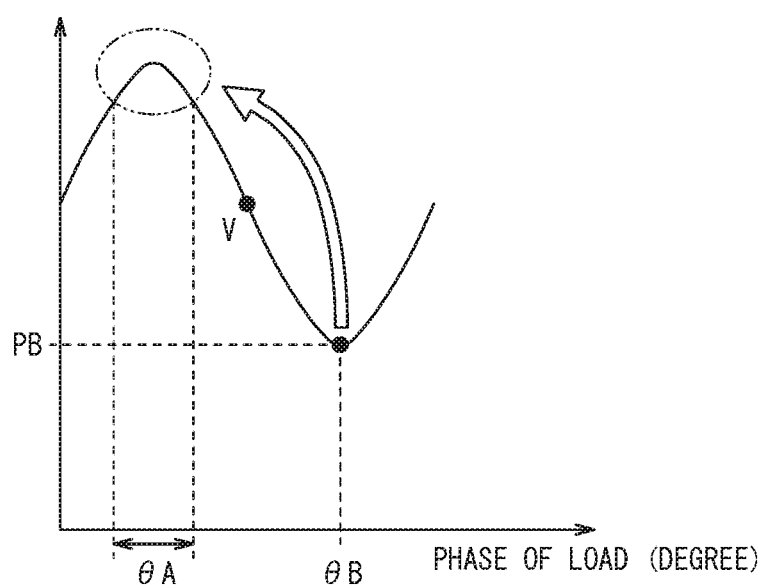
FIG. 9 is a diagram as a graph showing a relationship between the phase and the transmission efficiency in the MRI apparatus according to the first embodiment.

According to the modified example of the MRI apparatus 1, in the low load phantom or the no-load state, the line length (that is, the line length corresponding to the phase θB in FIG. 9) at which output is minimized is calculated, and then, a line length (for example, any one of the line lengths in the range of the phase θA in FIG. 9) obtained by adding/subtracting a predetermined line length to/from the calculated line length is presumed as the cable C having the line length set assuming a high load imaging target. According to the modified example of the MRI apparatus 1, even if there is the reflected wave, it is possible to perform, by installing the cable C having the estimated line length between the RF amplifier 323 and the transmission coil, an imaging without impairing the transmission efficiency of the RF amplifier 323.

According to the modified example of the MRI apparatus 1, the cable C having the estimated line length between the RF amplifier 323 and the transmission coil. Thereby, according to the modified example of the MRI apparatus 1, it is possible to avoid the internal power supply error caused by a reduction in the transmission efficiency of the RF amplifier 323.

According to the modified example of the MRI apparatus 1, it is unnecessary to provide the circulator inside the RF amplifier so as to avoid reaching the RF amplifier of the reflected wave, or to provide the hybrid 90-degree distribution circuit at the front stage of the WB coil. Thereby, according to the modified example of the MRI apparatus 1, it is possible to reduce the cost of adopting the above-described method including the circulator, and to reduce the development cost and time when adopting the above-described method including the hybrid 90-degree distribution circuit.

2. Second Embodiment

In the MRI apparatus 1 (and its modified example) according to the first embodiment shown in FIGS. 1 to 9, the appropriate line length (phase) to be provided is determined at the time of installation, and one cable C having the determined line length is installed between the RF transmitter 32 and the WB coil 12. The MRI apparatus 1A according to the second embodiment has a configuration which arranges a phase switcher having multiple line lengths between the RF transmitter 32 and the WB coil 12, and which appropriately selects an appropriate line length at the time of a preliminary imaging (also referred to as "pre-scan") for adjusting the output power of the RF amplifier 323 or the like. Thereafter, the MRI apparatus 1A according to the second embodiment performs a main imaging (also referred to as "main scan") to generate the diagnostic image in accordance with the line length and the imaging condition (also referred to as "imaging parameter") selected by the pre-scan.

It should be noted that the overall configuration of the MRI apparatus 1A is equivalent to the overall configuration of the MRI apparatus 1 shown in FIG. 1, and thus the description thereof is omitted.

Figure 10:
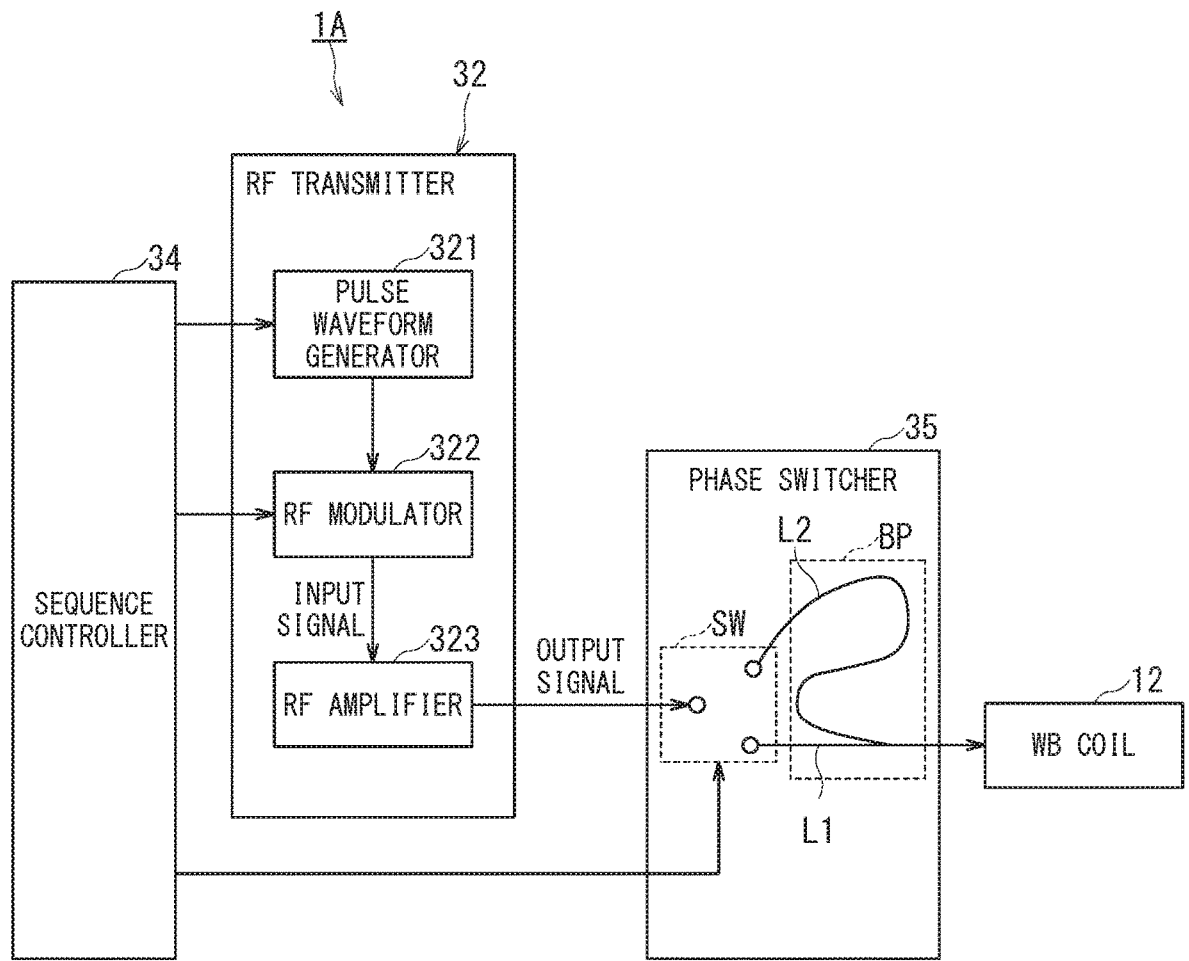
FIG. 10 is a diagram showing a detailed configuration of the a transmitter provided in an MRI apparatus according to a second embodiment.

FIG. 10 is a diagram showing a detailed configuration of the RF transmitter 32 provided in the MRI apparatus 1A. FIG. 10 also shows a connection relationship between the RF transmitter 32 and the WB coil 12.

In FIG. 10, the same members as those of the RF transmitter 32 shown in FIG. 2 are denoted by the same reference numerals, and the explanation thereof is omitted.

As shown in FIG. 10, the RF transmitter 32 includes a pulse waveform generator 321, an RF modulator 322, an RF amplifier 323, a directional coupler (not shown), a detector (not shown), and an AD converter (not shown).

The MRI apparatus 1A includes a phase switcher 35 between the RF transmitter 32 and the WB coil 12. The phase switcher 35 may be provided inside the RF transmitter 32. The phase switcher 35 includes a switch circuit SW and a substrate BP. The substrate BP includes multiple transmission lines between the RF amplifier 323 and the WB coil 12. The phase switcher 35 switches from one of multiple transmission lines to the other in accordance with a switching signal from the sequence controller 34.

Subsequently, an operation of the MRI apparatus 1A, that is, the method of adjusting the line length between the RF amplifier 323 and the WB coil 12 will be described with reference to FIGS. 10 and 11.

Figure 11:
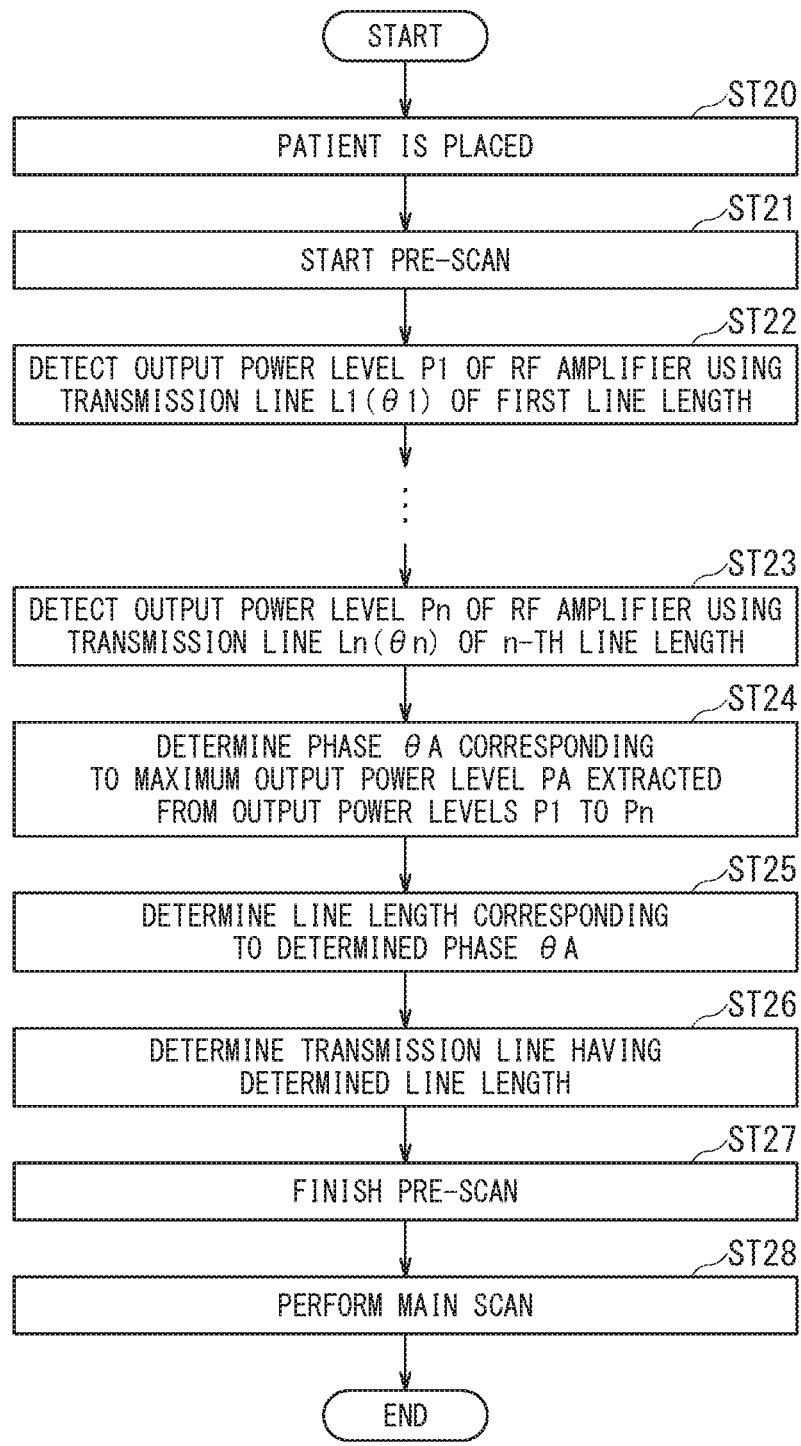
FIG. 11 is a flowchart showing an operation of the MRI apparatus according to the second embodiment.

FIG. 11 is a flowchart showing an operation of the MRI apparatus 1A.

The patient U is placed in the imaging area by the technician performing an imaging (step ST20). The sequence controller 34 starts a pre-scan for setting imaging conditions for executing a main scan (step ST21). In steps ST22 to ST23, the sequence controller 34 outputs the RF pulse signal by using the n transmission lines L1 to Ln having different phases, respectively, and thereby detecting, based on the RF pulse signals respectively output from the AD converter 326, the output power levels P1 to Pn of the RF amplifier 323. In other words, in steps ST22 to ST23, the sequence controller 34 sequentially switches n transmission lines L1 to Ln, thereby detecting the output power levels P1 to Pn of the RF amplifier 323 when the n transmission lines L1 to Ln are used.

Specifically, the sequence controller 34 switches the switch SW of the phase switch 35, and outputs the RF pulse signal on the first transmission line L1, and thereby detecting, based on the RF pulse signal output from the AD converter 326, the output power level P1 of the RF amplifier 323 is detected (step ST22). Next, the sequence controller 34 switches the switch SW of the phase switch 35, and outputs the RF pulse signal on the n-th transmission line Ln, and thereby detecting, based on the RF pulse signal output from the AD converter 326, the output power level Pn of the RF amplifier 323 is detected (step ST23).

The sequence controller 34 determines a predetermined phase, that is, a predetermined phase SA (shown in FIG. 6) corresponding to the maximum output power level PA (shown in FIG. 6) extracted from the n output power levels P1 to Pn detected in steps ST22 to ST23 (step ST24).

The sequence controller 34 determines the line length corresponding to the predetermined phase θA determined in step ST24 (step ST25), and determines a transmission line having the line length as the transmission line used for the main scan (step ST26). That is, in steps ST22 to ST26, the sequence controller 34 detects n output power levels P1 to Pn corresponding to n transmission lines, and selects the transmission line corresponding to the line length indicating the maximum output power level PA extracted from the n detected output power levels P1 to Pn. It should be noted that the present invention is not limited to the case where the maximum output power level PA is adopted. For example, the sequence controller 34 may add/subtract a predetermined line length to/from the line length indicating the minimum output power level PB extracted from the n detected output power levels P1 to Pn, and thereby selecting a transmission line having the calculated line length.

The sequence controller 34 finishes the pre-scan started in step ST21 (step ST27), and performs the main scan of the patient U using the transmission line determined in step ST26 (step ST28).

According to the MRI apparatus 1A, even if there is the reflected wave, it is possible to perform, by setting the transmission line having the appropriate line length corresponding to the load at the time of the pre-scan, an imaging without impairing the transmission efficiency of the RF amplifier 323. According to the MRI apparatus 1A, although the configuration of the phase switcher 35 is added to the first embodiment, the time for determining the appropriate line length is shortened.

Although the RF transmitter 32 shown in FIGS. 2 and 10 includes one RF amplifier 323, it is not limited to this case. The RF transmitter 32 may include two RF amplifiers 323 that output signals with two phases shifted by 90 degrees. In this case, each output of the RF amplifier 323 may be supplied to the I (In-phase) input and the Q (Quadrature) input of the two-channel WB coil configured as a QD coil. In this case, the two RF amplifiers 323 each include a switch SW and a substrate BP, and the line lengths from the two RF amplifiers 323 to the WB coil 12 are the same. It should be noted that the present invention is not limited to the case where the 2-channel WB coil configured as the QD coil is used, and a case where three or more channels of WB coils are used may be used.

According to at least one embodiment described above, it is possible to increase the transmission efficiency of the RF amplifier even when there is a reflected wave in a case of high load.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. An adjustment method of a magnetic resonance imaging apparatus, including a transmission coil configured to transmit a radio frequency (RF) pulse and an RF amplifier configured to transmit an RF pulse signal to the transmission coil, the method comprising steps of:
    detecting an output power level of the RF amplifier to the transmission coil;
    determining a line length of a transmission line to be provided between the RF amplifier and the transmission coil such that the output power level of the RF amplifier exceeds a predetermined value in a state where there is a load on the transmission coil, or such that the output power level of the RF amplifier falls below a predetermined value in a state where there is no load on the transmission coil; and
    providing information of the determined line length when installing the magnetic resonance imaging apparatus.

2. The method according to claim 1, wherein the determining includes determining the line length of the transmission line so that a transmission efficiency which is an input-output relationship of power related to the RF amplifier becomes substantially a maximum.

3. A magnetic resonance imaging apparatus comprising:
    a transmission coil configured to transmit an RF pulse;
    an RF amplifier configured to transmit an RF pulse signal to the transmission coil; and
    a phase adjustment cable provided between the RF amplifier and the transmission coil, a line length of the cable being determined when installing the magnetic resonance imaging apparatus, based on transmission efficiency or output power level of the RF amplifier.

4. The apparatus according to claim 3, wherein the phase adjusting cable is a cable:
    selected from multiple cables having different line lengths; and
    corresponding, when detecting the output power levels of the RF amplifier using the multiple cables, respectively, in a case where the output power level of the RF amplifier exceeds a predetermined value, to a line length indicating a maximum output power level extracted from the detected multiple output power levels.

5. The apparatus according to claim 4, wherein
the transmission coil is a whole body coil, and
the case where the output power level of the RF amplifier exceeds the predetermined value is a state in which a phantom simulating emission of a magnetic resonance signal from a human body part having a predetermined mass is placed in the whole body coil.

6. The apparatus according to claim 3, wherein the phase adjusting cable is a cable:
    selected from multiple cables having different line lengths; and
    corresponding, when detecting the output power levels of the RF amplifier using the multiple cables in a non-load state, respectively, to a line length calculated by adding or subtracting a predetermined line length to or from a line length indicating a minimum output power level extracted from multiple detected output power levels.

7. The apparatus according to claim 6, wherein
the transmission coil is a whole body coil,
in the no-load state, an inside of the whole body coil is empty.

8. The apparatus according to claim 3, further comprising a detector configured to detect the output power level of the RF amplifier wherein
the line length is determined based on the output power level detected by the detector.

9. A magnetic resonance imaging apparatus comprising:
    a transmission coil configured to transmit an RF pulse;
    an RF amplifier configured to transmit an RF pulse signal to the transmission coil;
    multiple transmission lines having respective multiple line lengths, the lines each being configured to transmit the RF pulse signal from the RF amplifier to the transmission coil;
    processing circuitry configured to determine any one of the multiple line lengths; and
    a switcher configured to switch, under a control of the processing circuitry, a transmission line to a transmission line having the determined line length.

10. The apparatus according to claim 9, wherein the processing circuitry is configured to:
  detect output power levels of the RF amplifier using the multiple transmission lines, respectively, and
  select a transmission line corresponding to a line length indicating a maximum output power level extracted from the multiple detected output power levels.

11. The apparatus according to claim 10, wherein the transmission coil is a whole body coil.

12. The apparatus according to claim 9, wherein the processing circuitry is configured to:
  detect output power levels of the RF amplifier using the multiple transmission lines, respectively; and
  select a transmission line having a line length calculated by adding or subtracting a predetermined line length to or from a line length indicating a minimum output power level extracted from the detected multiple output power levels.

13. The apparatus according to claim 12, wherein the transmission coil is a whole body coil.

14. The apparatus according to claim 9, wherein
  the RF amplifier comprises multiple RF amplifiers, and
  the processing circuitry is configured to set the line lengths determined in the multiple RF amplifiers to be same.

* * * * *